United States Patent
Wu et al.

(10) Patent No.: US 6,187,650 B1
(45) Date of Patent: Feb. 13, 2001

(54) METHOD FOR IMPROVING GLOBAL PLANARIZATION UNIFORMITY OF A SILICON NITRIDE LAYER USED IN THE FORMATION OF TRENCHES BY USING A SANDWICH STOP LAYER

(75) Inventors: Joseph Wu; Sheng-Fen Chiu; J. S. Shiao, all of Hsinchu (TW)

(73) Assignees: ProMOS Tech., Inc.; Mosel Vitelic Inc., both of Hsinchu (TW); Infineon Tech. Inc., Munich (DE)

( * ) Notice: Under 35 U.S.C. 154(b), the term of this patent shall be extended for 0 days.

(21) Appl. No.: 09/435,334

(22) Filed: Nov. 5, 1999

(51) Int. Cl.⁷ .................................... H01L 21/76

(52) U.S. Cl. .............. 438/424; 438/425; 438/426; 438/427; 438/439

(58) Field of Search ................... 438/424, 425, 438/426, 427, 439

(56) References Cited

U.S. PATENT DOCUMENTS

| | | | |
|---|---|---|---|
| 5,360,753 | * 11/1994 | Park et al. . | |
| 5,783,476 | * 7/1998 | Arnold | 438/425 |
| 5,817,568 | * 10/1998 | Chao | 438/427 |
| 5,866,466 | * 2/1999 | Kim et al. | 438/426 |
| 5,894,059 | * 4/1999 | Peidous et al. | 438/316 |
| 5,910,018 | * 6/1999 | Jang | 438/425 |

\* cited by examiner

*Primary Examiner*—Long Pham
(74) *Attorney, Agent, or Firm*—Blakely, Sokoloff, Taylor & Zafman, LLP

(57) ABSTRACT

A method of forming a planar silicon nitride layer is disclosed. The method comprises: forming a pad oxide layer; forming a first nitride layer on the pad oxide layer; forming a stop layer on the first nitride layer; forming a second nitride layer on the stop layer; performing intermediate processes that damage the second nitride layer; removing the second nitride layer; removing the stop layer such that the first nitride layer remains as the planar silicon nitride layer.

6 Claims, 3 Drawing Sheets

METHOD FOR IMPROVING GLOBAL PLANARIZATION UNIFORMITY OF A SILICON NITRIDE LAYER USED IN THE FORMATION OF TRENCHES BY USING A SANDWICH STOP LAYER

FIELD OF THE INVENTION

The present invention relates to a method of forming isolation for integrated circuits, and more specifically, to a method of forming a planar silicon nitride layer for use in shallow trench isolation or DRAM trench capacitors.

BACKGROUND OF THE INVENTION

In the formation of integrated circuits, the manufacture of isolation structures between semiconductor devices for insulating purposes is crucial. In either ULSI or in VLSI, a tiny amount of leakage current can induce significant power dissipation for the entire circuit. Therefore, it is very important to form an effective isolation between semiconductor devices. In addition, with the trend towards higher density integration, effective isolation must be done in a smaller isolation space.

Presently, various isolation technologies have been proposed. These include LOCOS (LOCal Oxidation of Silicon) and shallow trench isolation (STI) technologies. The most widely used method for forming isolation regions is the LOCOS structure. The LOCOS structure involves the formation of Field OXides (FOX) in the nonactive regions of the semiconductor substrate. In the other words, the FOX is created on the portion of the wafer that is not covered by a silicon nitride/silicon oxide composition layer. Unfortunately, the surface topography of the FOX cannot meet the stringent space demands of submicron devices. Additionally, as device geometry reaches submicron size, conventional LOCOS isolation has a further limitation. Notably, the bird's beak effect causes unacceptably large encroachment of the FOX into the device active regions.

Trench isolation is one of the newer approaches adopted and is used primarily for isolating devices in VLSI and ULSI. Trench isolation can be considered as a replacement for conventional LOCOS isolation. As seen in FIG. 1, in the basic STI technology, a pad layer 103 is first formed on the semiconductor wafer 101. The pad layer 103 may be formed by oxidizing a bare silicon wafer in a furnace to grow the pad oxide layer 103 of about 100 to 250 angstroms thickness. The pad oxide layer 103 is most typically formed from silicon dioxide.

Next, a furnace silicon nitride layer 105 of about 1500 to 2000 angstroms thickness is then deposited on the pad oxide layer. The silicon nitride layer 105 is used as a stop layer and is formed on the pad oxide layer 103. Turning to FIG. 2, a masking and etching step is then performed to form trenches 201 about 0.4 to 0.5 μm in depth by anisotropically etching into the silicon wafer.

Next, an oxide is deposited onto the wafer. The oxide may be a CVD oxide or a high density plasma chemical vapor deposition (HDPCVD) oxide. Typically, the oxide 203 needs to be planarized using a chemical mechanical polishing (CMP) technique.

The use of silicon nitride in the formation of trenches is a common technique. Indeed, not only is silicon nitride used in the formation of trenches for STI, but also in the formation of trenches for DRAM trench capacitors.

It has been found that when performing the CMP process to planarize the oxide layer 203, a within wafer variation in the planarity of the silicon nitride layer exists. In other words, the silicon nitride layer is not globally planar over an entire wafer. This is believed to be caused by prior steps in the manufacturing process. The variation in the silicon nitride level causes variation in the planarity of the STI structures, which can be a factor device threshold voltage ($V_t$) variation.

Therefore, a need arises for an improved method of forming a silicon nitride layer that has high global planarity. The silicon nitride layer can then be used in the process of forming trenches for either STI or DRAM capacitors.

SUMMARY OF THE INVENTION

A method of forming a planar silicon nitride layer is disclosed. The method comprises: forming a pad oxide layer on said substrate; forming a first nitride layer on said pad oxide layer; forming a stop layer on said first nitride layer; forming a second nitride layer on said stop layer; performing intermediate processes that damage said second nitride layer; removing said second nitride layer; removing said stop layer such that said first nitride layer remains as said planar silicon nitride layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
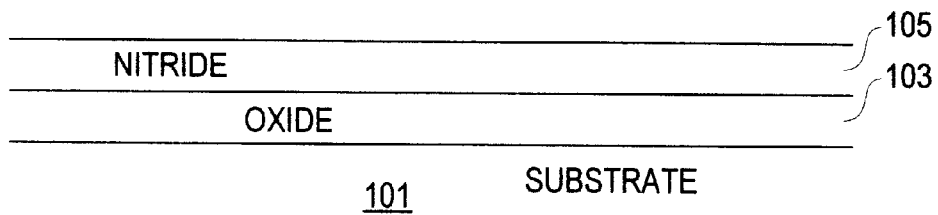
FIGS. 1 and 2 are cross-sectional views of a semiconductor substrate illustrating a prior art method for forming a shallow trench isolation.
Figure 2:
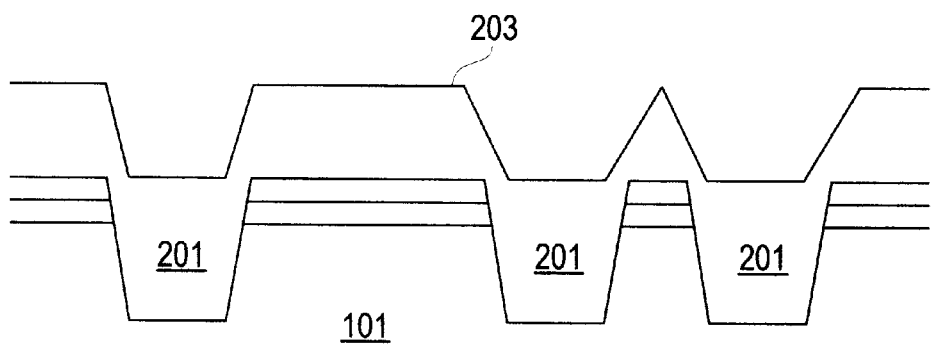
Figure 3:
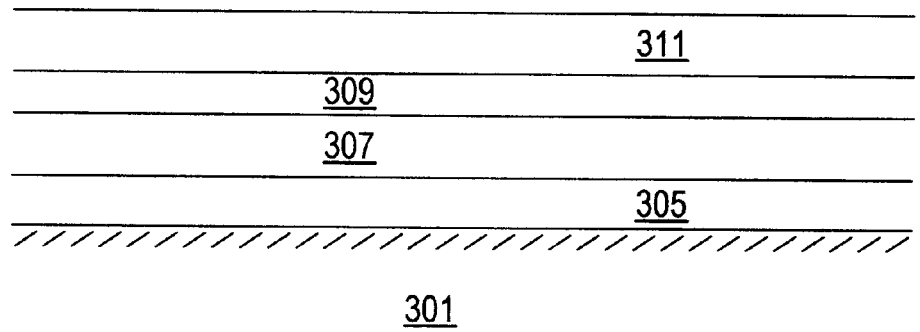
FIGS. 3–6 are cross-sectional views of a semiconductor substrate illustrating the method of the present invention.

In accordance with the present invention, a new method of forming STI is disclosed. Turning to FIG. 3, a cross section of a semiconductor substrate 301 is shown. The substrate 301 can be p-type or n-type silicon. A thin silicon dioxide layer 305 is formed on the substrate 301 to act as a pad oxide layer. The pad oxide layer 305 is typically formed by thermal oxidation in an oxygen ambient or by any suitable oxide chemical compositions and procedures. In this embodiment, the thickness of the pad oxide layer 305 is approximately 200 angstroms.

Subsequently, a first $Si_3N_4$ layer (approximately 1000 to 1500 angstroms) or a boron nitride (BN) layer (approximately 1000 to 1500 angstroms) 307 is deposited on the pad oxide layer 305. Any suitable conventional process can be used to deposit the first $Si_3N_4$ or BN layer 307. For example, low pressure chemical vapor deposition (LPCVD), plasma enhanced chemical vapor deposition (PECVD), or high density plasma chemical vapor deposition (HDPCVD) may be used.

Still referring to FIG. 3, a stop layer 309 (about 150 to 250 angstroms) is deposited on the $Si_3N_4$ or BN layer 307. The stop layer should be chosen from a material that has good etching selectivity relative to the nitride layer 307. In the preferred embodiment, the stop layer 309 can be formed from an oxide, such as CVD oxide or HDPCVD oxide. Oxide exhibits good etching selectivity with nitride when the etchant of the nitride is $H_3PO_4$.

Next, a second $Si_3N_4$ layer (approximately 600 to 800 angstroms) or a boron nitride (BN) layer (approximately 600 to 800 angstroms) 311 is deposited on the stop layer 309. Any suitable conventional process can be used to deposit the second $Si_3N_4$ or BN layer 311. For example, low pressure chemical vapor deposition (LPCVD), plasma enhanced chemical vapor deposition (PECVD), or high density plasma chemical vapor deposition (HDPCVD) may be used.

It should be noted that the total thickness of the first silicon nitride layer 307, the stop layer 309, and the second silicon nitride layer 311 can be determined according to the relevant processes needed, as well as the parameters of the trench to be formed.

Figure 4:
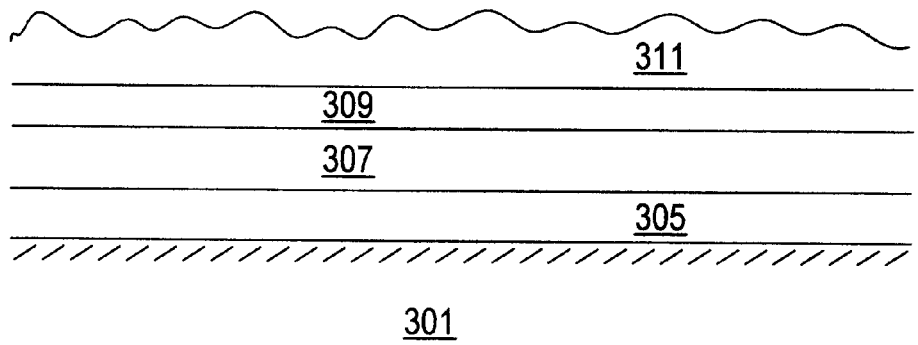

Turning next to FIG. 4, it has been found that through several intermediate processes, the second silicon nitride layer 311 experiences degradation to its surface. For example, processes such as deep trench (DT) etch, recess processes, poly recess, collar etch, chemical mechanical polishing, active area etch, and others tend to deplanarize the surface of the second silicon nitride layer 311. Without the method of the present invention, the non-planar nature of the silicon nitride layer would cause difficulties in later process steps. This is particularly true in processes associated with the manufacture of DRAM devices due to the many complex steps in the manufacturing process.

Figure 5:
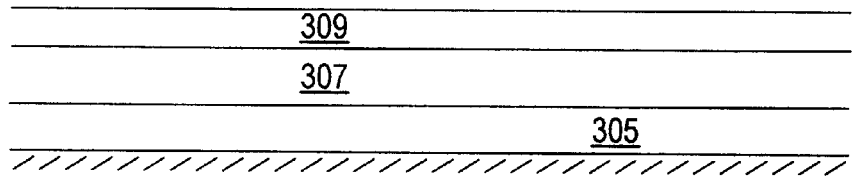

Turning to FIG. 5, in accordance with the present invention, the second silicon nitride layer 311 is removed. For example, the second silicon nitride layer 311 may be etched away using $H_3PO_4$. Because the oxide layer 309 is relatively unaffected by the $H_3PO_4$, the result is shown in FIG. 5.

Figure 6:
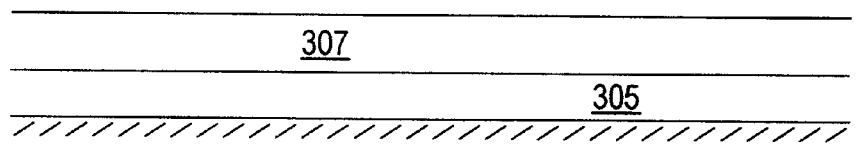

Next, the oxide layer 309 is removed preferably by a wet etch, such as by a dilute HF solution. The result is seen in FIG. 6. As can be seen, the end result is a planar first silicon nitride layer 307 that has been protected from the prior art damage caused by intermediate processes.

While the preferred embodiment of the invention has been illustrated and described, it will be appreciated that various changes can be made therein without departing from the spirit and scope of the invention.

What is claimed is:

1. A method of forming a planar silicon nitride layer on a substrate, said method comprising:

forming a first nitride layer on said substrate;

forming a stop layer on said first nitride layer, said stop layer having a thickness of about 150 angstroms;

forming a second nitride layer on said stop layer;

performing intermediate processes that damage said second nitride layer;

removing said second nitride layer using said stop layer as an etching stop; and removing said stop layer.

2. The method of claim 1 further comprising the step of forming a pad oxide layer on said substrate and underneath said first silicon nitride layer.

3. The method of claim 1 wherein said planar silicon nitride layer is used for forming a trench in said substrate.

4. The method of claim 1 wherein said stop layer is formed from an oxide.

5. The method of claim 1 wherein said first and second nitride layers are $Si_3N_4$ or BN.

6. The method of claim 4, wherein said stop layer is formed by chemical vapor deposition of said oxide.

* * * * *